United States Patent
Khemka et al.

(10) Patent No.: US 7,282,386 B2
(45) Date of Patent: Oct. 16, 2007

(54) SCHOTTKY DEVICE AND METHOD OF FORMING

(75) Inventors: Vishnu K. Khemka, Phoenix, AZ (US); Vijay Parthasarathy, Palo Alto, CA (US); Ronghua Zhu, Chandler, AZ (US); Amitava Bose, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 208 days.

(21) Appl. No.: 11/117,996

(22) Filed: Apr. 29, 2005

(65) Prior Publication Data

US 2006/0246670 A1 Nov. 2, 2006

(51) Int. Cl.
*H01L 21/00* (2006.01)
(52) U.S. Cl. .......................... 438/92; 438/140
(58) Field of Classification Search ............... 438/92, 438/167, 140, 570; 257/484, 476
See application file for complete search history.

(56) References Cited

U.S. PATENT DOCUMENTS

| | | | |
|---|---|---|---|
| 4,989,058 A | 1/1991 | Colak et al. | |
| 5,629,535 A * | 5/1997 | Ajit | 257/120 |
| 6,476,442 B1 | 11/2002 | Williams et al. | |
| 6,552,406 B1 | 4/2003 | Voldman | |
| 6,617,642 B1 | 9/2003 | Georgescu | |
| 6,784,489 B1 | 8/2004 | Menegoli | |
| 6,806,548 B2 * | 10/2004 | Shirai et al. | 257/473 |

FOREIGN PATENT DOCUMENTS

EP 1233456 A2 8/2002

OTHER PUBLICATIONS

Agarwal, A., et al., "Design of Dual Use, High Efficiency, 4H-SIC Schottky and MPS", Air Force Research Lab, Power Div., pp. 180-184, AIAA-2000-2829, Cree, Inc., Durham NC, 2000.
Shimizu, Takashi, et al., "100V Trench MOS Barrier Schottky Rectifier Usign Thick Oxide Layer (TO-TMBS)", Procedings of 2001 International symposium on Power Semiconductor Devices & ICs, Osaka, pp. 243-246, R&D Center, Shindengen Electic Maf. Co., Saitama, Japan, 2001.
Nunes, Benjamin, et al., "No cost" Reduced-Leakage Schottky Diode by Ion Implantation, Massachusetts Institute of Technology and Fairfield Semiconductor Corp., pp. 172-177, 1999 IEEE/SEMI Advanced Semiconductor Manufactureing Conference, 1999.
Khemka, V., et al., "A Fully Planarized 4H-SiC Trench MOS Barrier Schottky (TMBS) Rectifier", IEEE Electron Device Letter, pp. 286-288, vol. 21, No. 5. May 2000, 2000.
Smith, Jeffrey, et al., "A 0.7 um Linear Bicmos/DMOS Technology for Mixed-Signal/Power Applications", IEEE BCTM 9.4, pp. 155-157, 1997 IEEE, Texas Instruments Inc., dallas, TX.
Kunori, S., et al., "120V Multi RESURF JunctionBarier Schottky Rectifier (MR-JCB)", pp. 97-100, 2002 IEEE, R&D Center, shindengen Electric Mfg. Co., Saitama, Japan, 2002.

* cited by examiner

*Primary Examiner*—Theresa Doan (57) ABSTRACT

A Schottky device having a plurality of unit cells, each having a Schottky contact portion, surrounded by a termination structure that causes depletion regions to form in a vertical and horizontal direction, relative to a surface of the device, during a reverse bias voltage condition.

13 Claims, 8 Drawing Sheets

SCHOTTKY DEVICE AND METHOD OF FORMING

CROSS REFERENCE TO RELATED APPLICATIONS

This application is related to U.S. patent application Ser. No. 10/881,678 filed on Jun. 30, 2004, which is hereby incorporated in its entirety by reference.

FIELD OF THE DISCLOSURE

The present disclosure relates generally to a semiconductor device and process, and more particularly to a semiconductor device having a Schottky device and process of disposing the Schottky device at a semiconductor substrate.

DESCRIPTION OF THE RELATED ARTS

BACKGROUND

Conventional Schottky diodes typically have high leakage currents that increase rapidly as reverse bias voltage increases, thereby degrading device performance. In addition, the resulting high electric fields at the Schottky region cause the Schottky region to breakdown, potentially damaging the device at relatively low breakdown voltages. Therefore, a device and method to limit the leakage current and provide a larger breakdown voltage would be useful.

DETAILED DESCRIPTION

Lateral RESURF (reduced surface field) Schottky devices are disclosed that utilize the RESURF action to shield the Schottky region of the device from high electric fields. A double RESURF Schottky device introduced that depletes a region containing the Schottky contact in a horizontal and vertical direction, thereby more effectively clamping the electric field seen at the Schottky contact as reverse bias voltage increases. This double RESURF action results in a Schottky device that is less susceptible to high leakage current in reverse bias conditions. The Schottky device of the present disclosure is better understood with reference to FIGS. 1-13.

Figure 1:
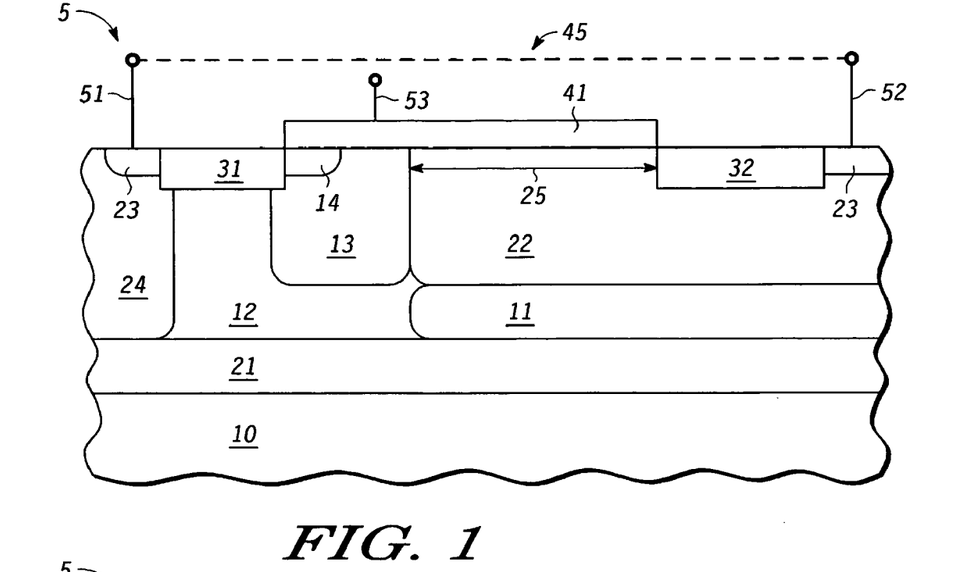
FIG. 1 illustrates a cross-sectional view of a Schottky device in accordance with the present disclosure.

FIG. 1 illustrates a cross sectional view of a Schottky device disposed at a location 5 of a bulk substrate 10 in accordance with a specific embodiment of the present disclosure. FIGS. 2-12 herein disclose specific processing flows for forming the Schottky device of FIG. 1.

Figure 2:
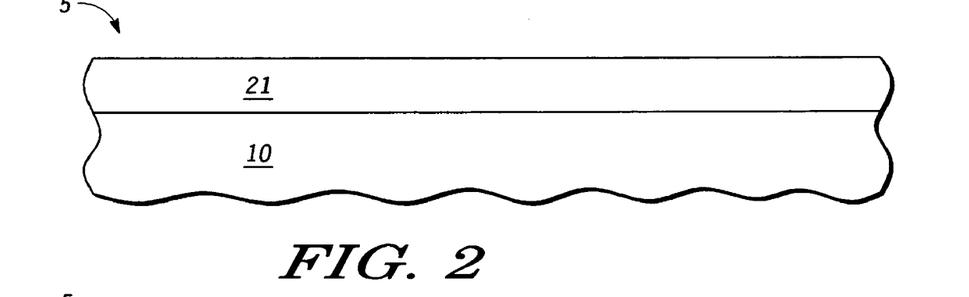
FIGS. 2-9 illustrate the Schottky device of FIG. 1 at various stages of a manufacturing process in accordance with the present disclosure.

FIG. 2 illustrates a bulk substrate 10 that includes an upper layer 21. In one embodiment, the bulk substrate 10 is a P-doped mono-crystalline substrate semiconductor substrate, such as silicon. However, the bulk substrate 10 can include other embodiments, e.g., silicon-on-insulator, silicon on sapphire, gallium arsenide, and the like. In one embodiment, a bulk substrate 10 of silicon having a P-type doping concentration in the range of approximately $1e15$-$1e19/cm^3$ is used, while the layer 21 is a doped portion of the substrate having a conductivity-type opposite that of the bulk material. For example, layer 21 can be an N-doped layer having a doping concentration in the range of approximately $1e18$-$3e19/cm^3$, with a typical range of $1$-$2 \times 1e19/cm^3$.

In one embodiment, the layer 21 is to create an N-type buried layer (NBL) in the final device, and can be formed by implanting an N-type species, such as antimony, using known dopant implantation techniques.

In an alternate embodiment, no separate layer 21 is needed. For example, a bulk substrate having an N-type dopant concentration in the range of $1e18$-$3e19/cm^3$ or $1$-$2 \times 1e19/cm^3$ can be used without a uniquely doped upper layer 21. Therefore, in an alternate embodiment, layer 21 merely represents an upper portion of the bulk substrate 10.

Figure 3:
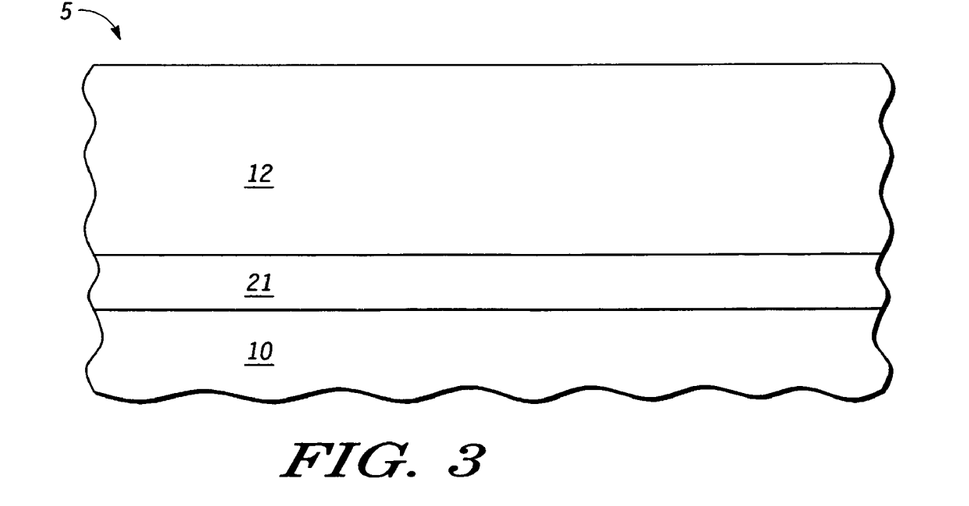

FIG. 3 illustrates location 5 subsequent to the formation of an epitaxial layer 12. Typically the epitaxial layer 12 will comprise a semiconductor material similar to that of the bulk substrate 10. For purposes of discussion, the epitaxial layer 12 is presumed to be an epitaxial silicon layer, overlying layer 21. The epitaxial layer 12 as formed has a conductivity-type opposite the layer 21, i.e. a P-doped epitaxial layer is described in the current description. In various embodiments, layer 12 has a thickness in a range of 2-4 microns, 2.5-3.5 microns, or 3.25 microns-3.75 microns. A typical P-type dopant concentration of layer 12 is in the range of approximately $2$-$5e15/cm^3$. In one embodiment, implanting the dopant species subsequent to epitaxial formation forms the doped epitaxial layer 12. In another embodiment, the dopant species is provided during epitaxial formation. Though the specific embodiment of FIGS. 2 and 3 disclose an epitaxial layer overlying a bulk substrate, it will be appreciated that the use of an epitaxial layer is not needed to create the Schottky device the present disclosure. For example, layer 10 can be an unprocessed bulk substrate, while layers 21 and 12 can be doped portions of the bulk substrate.

Figure 4:
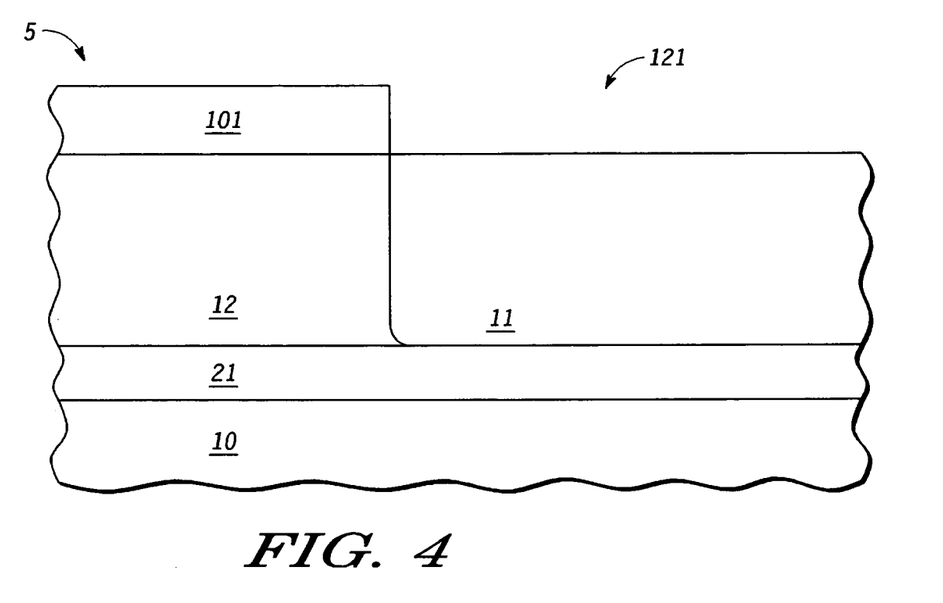

FIG. 4 illustrates location 5 subsequent to the formation of a mask layer 101. Mask layer 101 has an opening 121 (partially illustrated) that defines the location of one or more well regions to be formed having a conductivity-type opposite that of the epitaxial layer 12. Region 11 is a doped region of the same conductivity-type as epitaxial layer 12, though more heavily doped. For example, region 11 can have a doping concentration in the range of $1$-$5e16/cm^3$ or a range of $2$-$3e16/cm^3$. As illustrated in FIG. 1, only the lower portion of region 11 will remain in the final Schottky device. In one embodiment layer 11 is formed by implanting a P-type species, such as Boron.

Figure 5:
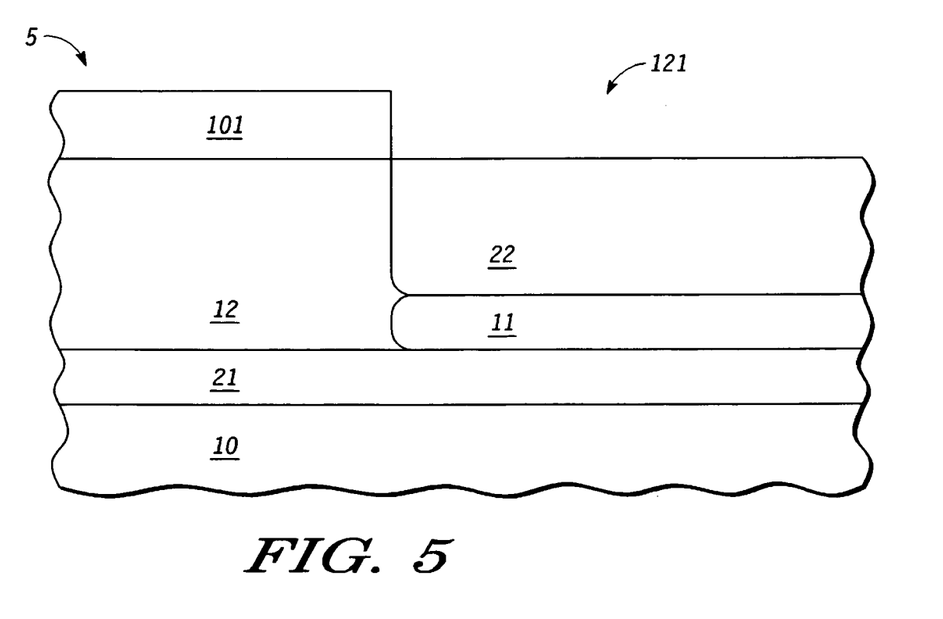

FIG. 5 illustrates location 5 subsequent to the formation of N-type region 22, which includes the drift region for the Schottky device of FIG. 1. The region 22 is typically formed using the same mask layer 101 as the region. Region 22 is formed within a region having an opposite conductivity type. For example, when region 22 is an N-type region, it is formed within and adjacent to a P-type region that is the combination of regions 11 and 12. The dopant concentration of N-well 22 is approximately 2-4e16/cm^3, and can be formed by implanting phosphorous subsequent to formation of region 11. It will be appreciated that multiple well regions can be formed simultaneously on the same semiconductor device using the process described. In a particular embodiment, wells similar to region 22 will contain logic devices. The Schottky region is disposed of at region 22 to provide voltage-blocking capability during reverse bias conditions and good on-resistance characteristics when forward biased as will be discussed in great detail herein.

Figure 6:
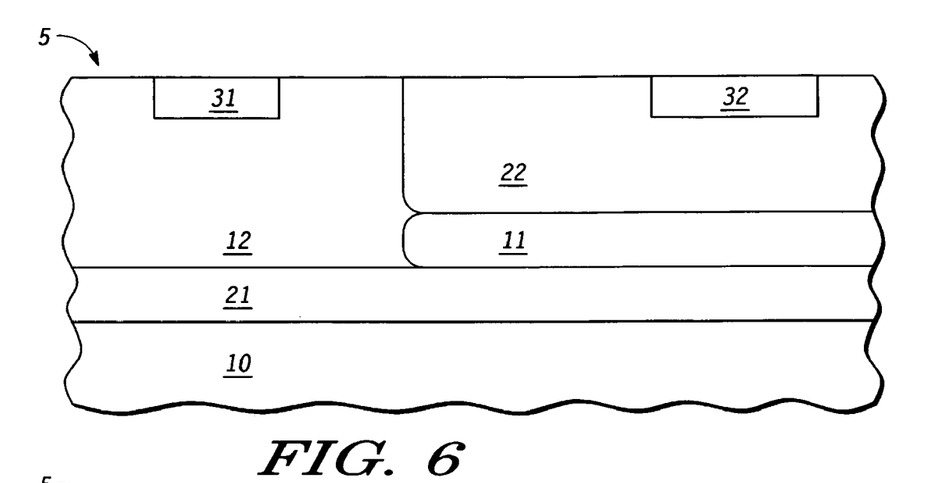

FIG. 6 illustrates location 5 subsequent to the formation of dielectric regions 31 and 32 within regions 12 and 22 respectively. Typically, the dielectric regions 31 and 32 are oxide regions formed using any suitable shallow trench isolation process. In an alternate embodiment, dielectric regions 31 and 32 can be formed on the regions 12 and 22.

Figure 7:
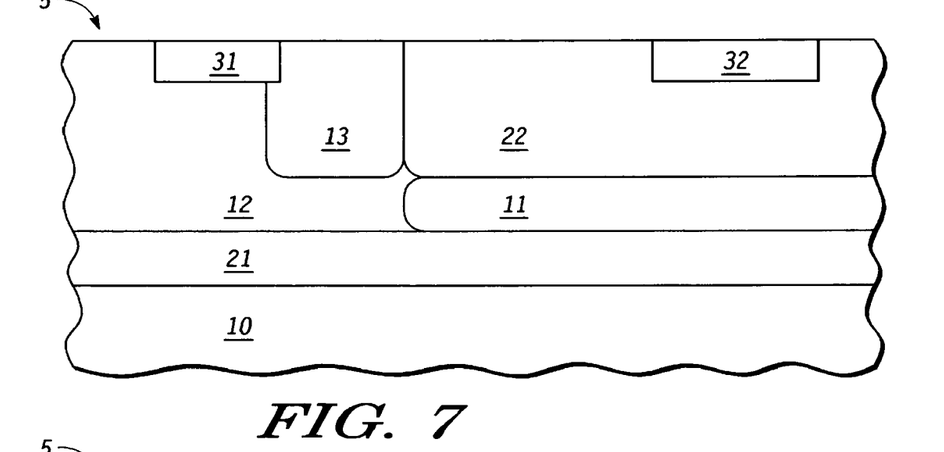

FIG. 7 illustrates location 5 subsequent to the formation of a region 13 of the same conductivity type as region 12. For example, region 13 can be a P-type region formed using known masking techniques. In a specific embodiment, P-type region 13 is referred to as a P-body, and will have a dopant concentration greater than region 12 of approximately 1-5e17/cm^3, and can be formed by implanting a P-type species, such as Boron. The region 12, as illustrated, is immediately adjacent to region 22, however, portions of region 12 may reside partially, or entirely between regions 13 and 22.

Figure 8:
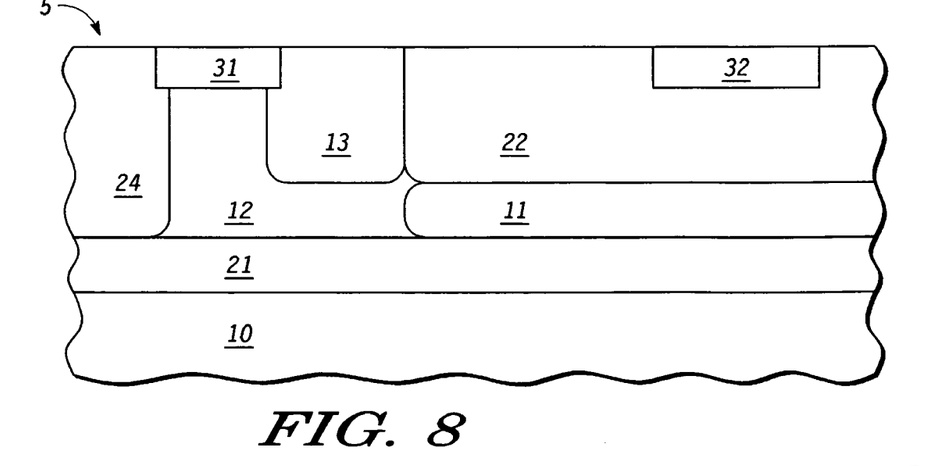
Figure 9:
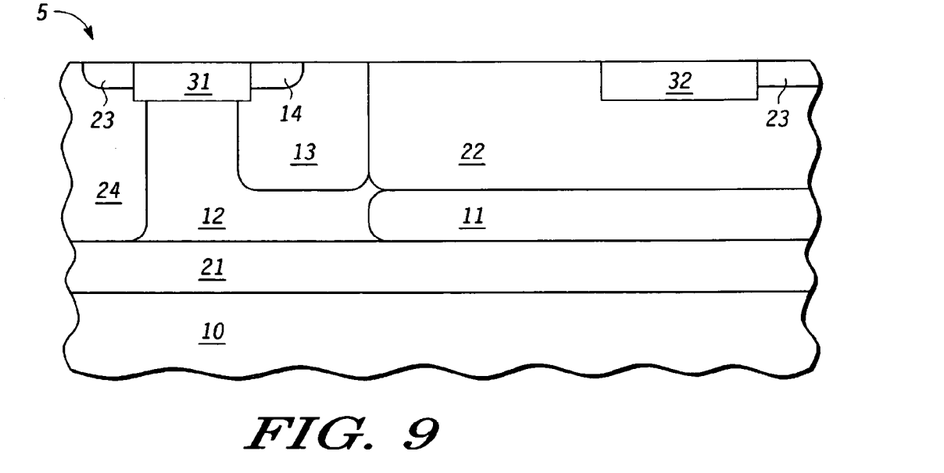

FIG. 8 illustrates location 5 subsequent to the formation of the doped region 24. Doped region 24, also referred to as a sinker, has a conductivity-type (polarity) that is the same as the layer 21, and is thereby electrically coupled to the buried layer 21. The dopant concentration of region 24 is typically larger then that of buried layer 21, and is in the range of 1e17 to 1e19/cm^3. In one embodiment, region 24 is formed by implanting an N-type species, such as phosphorus. FIG. 9 illustrates location 5 subsequent to formation of doped regions 14 and 23. Doped regions 23 create contacts referred to as ties to commonly doped regions 24 and 22. Doped region 14 creates a tie to region 13, where regions 13 and 14 are of the same conductivity-type. Typical dopant concentrations of the regions 14 and 23 are in the range of approximately 5e19-1e20/cm^3.

FIG. 1 illustrates location 5 subsequent to the formation of a conductive layer 41, a portion of which is a Schottky contact to the region 22 in that it has an appropriate work function differential between itself and the underlying region 22 to form a Schottky region 25. In one embodiment, the conductive layer 41 is a silicide 41 formed by the deposition and anneal of Cobalt metal. A terminal 53 is illustrated connected to the silicide 41. The term "terminal" is used broadly to indicate a conductive element or portion of a conductive element that interfaces to a portion of the Schottky device of FIG. 1. A terminal will typically have conductivity greater than the regions of the Schottky device to which it contacts. For example, a contact via or conductive trace formed of a metal or heavily doped poly silicon will typically form a terminal. In one embodiment, the silicide 41 is a portion of the conductive structure that forms the anode of the Schottky device, while a terminal 52 is a portion of a conductive structure that interfaces with well tie 23 and forms a cathode contact to the Schottky device.

Note that FIG. 1 also illustrates a connection 45, which is a conductive connection, such as a metal trace, connecting the tie 23 of region 22 to the tie 23 of region 24. The terminals 51 and 52 may be considered part of the connection 45, or separate from the connection 45. In an alternate embodiment, the connection 45 can be replaced with a connection between the anode 53 and the tie 23 to region 24 as will be discussed further herein.

The silicide 41 is in contact with a first region and a second region of opposite conductivity types. In one embodiment, the first region is a P-type region formed by regions 11, 12, 13 and 14, while the second region is a N-type region formed by regions 22 and 23. Terminal 52 of the Schottky device is electrically coupled to the region 22 through the tie region 23. At least a portion of the P-type region 11 immediately underlies the region 22 and is in electrical contact with the silicide 41 through P-type regions 12, 13 and 14.

Figure 10:
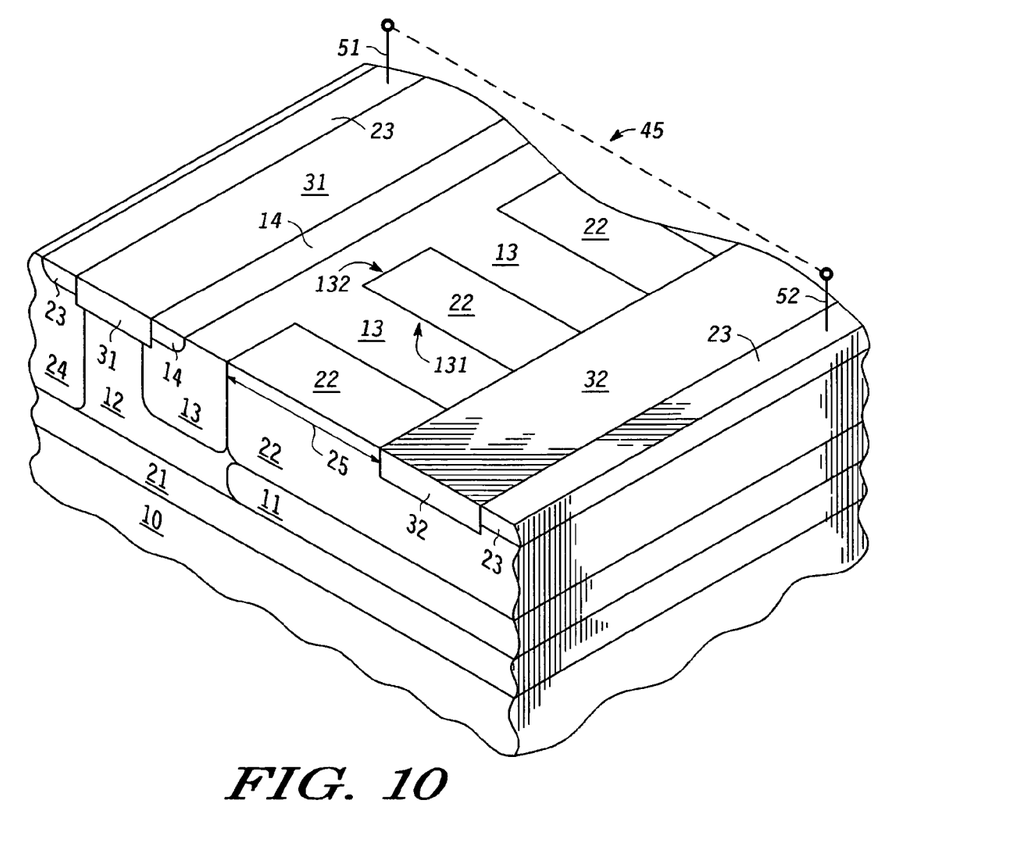
FIGS. 10 and 11 illustrate three-dimensional views of the Schottky device of FIG. 1 in accordance with specific embodiments of the present disclosure.

FIG. 10 illustrates a three-dimensional representation of a specific embodiment of a Schottky device. Note, the silicide 41 is not illustrated for purposes of clarity and would typically overly the interleaved structures between the isolation regions 31 and 32, and be in contact with terminal 53 (such as shown in FIG. 1). More specifically, FIG. 10 illustrates interleaved structures formed from regions 13 and 22, as viewed from a plan view of the Schottky device. For example, a common interface location 131 is shared between an interleave structure of region 22 and an interleave structure of region 13; thereby creating a planar interface that is substantially orthogonal to the upper surface of the Schottky device. Note that the common interface 131 may not be shared by regions 13 and 22 along the entire depth of the regions 12 and 22, and that part of p-type region 12 may interface with region 22, thereby separating regions 13 and 22.

The interleave structure of region 22 also shares a common interface 132 with region 13 to create generally a planar interface that is substantially orthogonal to the upper surface of the Schottky device and to the plane formed by common interface 131. Note that the regions 11, 12, and 13 make a region having a common conductivity type, and that a substantially planar interface is formed between an interleave structure of region 22 and the underlying region 11. This interface is substantially orthogonal to the planes formed by common interfaces 131 and 132. In one embodiment, the P-type interleave structures of region 13 extend to the buried layer 11. In an alternate embodiment, the P-type interleave structures of region 13 stop within the region 22. As used herein, substantially orthogonal planes include planes at 90-degree angles, 85-95 degree angles, and 80-100 degree angles, relative to each other.

Figure 11:
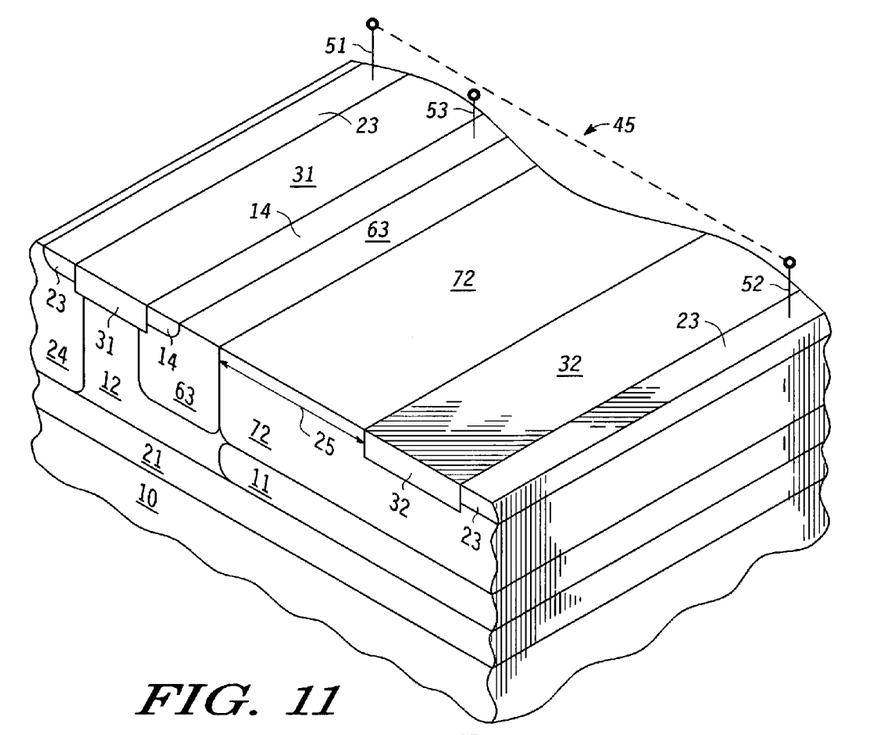

FIG. 11 illustrates a three-dimensional view of an alternate embodiment of the present disclosure. Specifically, FIG. 11 illustrates a Schottky device similar to that described at FIG. 10. However, instead of having the interleaved structures of regions 13 and 22, non-interleaved regions 63 and 72 are illustrated that are analogous to regions 13 and 22 without interleave structures.

In operation, the disclosed Schottky device of FIG. 1 conducts current from the anode 53 to the cathode 52 when forward biased. However, a Schottky region 25 formed in the N-type region 22 underlying the silicide 41, limits current flow in the reverse direction during a reverse bias condition. During a reverse bias condition, the Schottky device of FIG. 1 forms a depletion region that extends into the region 22 from multiple directions. First, the region 22 is depleted from left-to-right, i.e. from the region 13 as illustrated in FIG. 1. Second, the region 22 is depleted into and out of the page illustrating FIG. 1 when the regions 13 and 22 are interleaved. These first and second depletion actions cause a single-RESURF (Reduced Surface Field) action in that they deplete region 22 in a direction parallel to a plane that is substantially parallel with the interface between region 22 and silicide 41. Finally, because the Cathode 52 is electrically connected to the buried layer 21 through region 24, the region 11 is depleted during reverse bias, thereby enhancing the depletion of the region 22 during reverse bias in a second plane substantially orthogonal to the plane formed by the interface between region 22 and silicide 41. When depletion action from below is included, the effect is referred to as a double-RESURF action.

The depletion region created from left-to-right in the region 22 during reverse bias will extend past the Schottky region underlying the silicide 41 to the isolation region 32 as the reverse bias voltage increases. This extension of the depletion region past the Schottky region substantially clamps the electric field seen the Schottky region as the reverse bias voltage increases, and hence limits the reverse leakage current through the Schottky region. As a result of this clamping effect, the Schottky device of FIG. 1 is substantially less susceptible to high leakage current in reverse bias conditions than conventional devices.

In an alternate embodiment, the anode 53, instead of the cathode 52, of the Schottky device can be connected to the tie 23 of region 24. In this configuration, a reverse bias voltage will not result in the depletion of region 11 or the double RESURF action from the bottom of layer 22.

Figure 12:
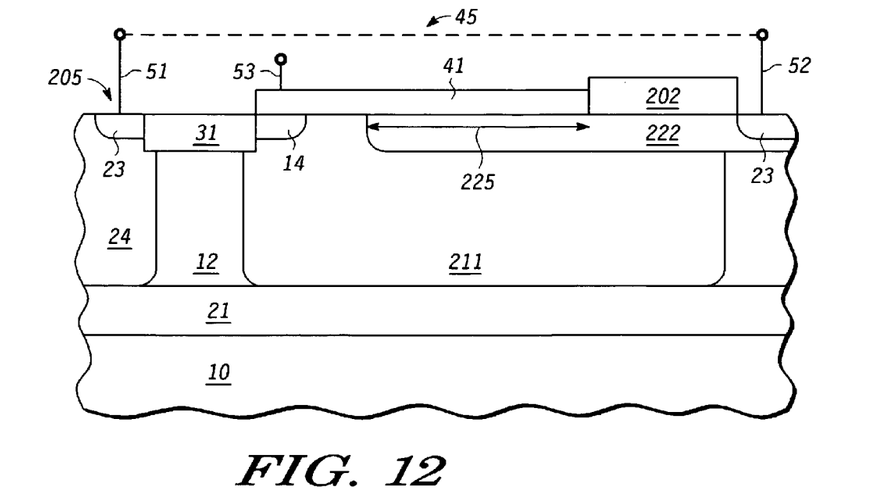
FIGS. 12-14 illustrate cross-sectional views of Schottky devices in accordance with alternate embodiments of the present disclosure.

FIG. 12 illustrates a cross-sectional view of an alternate embodiment of the present disclosure. Specifically, the Schottky device of FIG. 12 is similar to the Schottky device of FIG. 1, and analogous regions are commonly numbered. However, instead of implementing separate layers 11 and 13 having a common conductivity type, only a single region 211 is implemented. A dielectric layer 202 is disposed prior to formation of the silicide 41 and separates the tie region 23 from the Schottky region 225. A N-type region 222 is disposed within the epitaxial layer 12 and overlies a portion of P-type region 211. Note that the N-type region 222 has been illustrated as significantly thinner than the N-type region 22 of previous embodiments to emphasize the fact that the thickness of the N-type region can vary from embodiment to embodiment. Subsequent to formation of the silicide 41 a Schottky region 225 will result at the N-type region 222. Operation of the device of FIG. 12 is similar to that of FIG. 1, wherein depletion occurs in the lateral direction to protect the Schottky region 225 during high-voltage reverse bias conditions.

Figure 13:
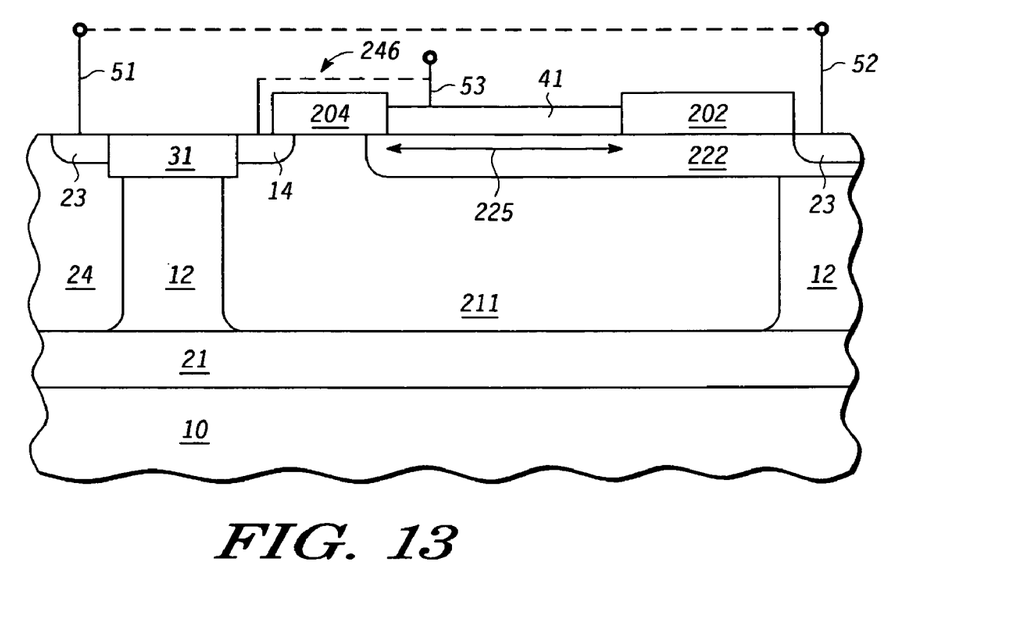

FIG. 13 illustrates a cross-sectional view of an alternate embodiment of the present disclosure. Specifically, the Schottky device of FIG. 13 is similar to the Schottky device of FIG. 12. Analogous regions between FIGS. 12 and 13 are commonly numbered. The Schottky device of FIG. 13 differs from the Schottky device of FIG. 12 in that a dielectric spacer 204 is disposed over the P-type region 211 between region 31 and silicide 41. In this manner, the length of Schottky region 225 is the distance between the dielectric spacers 202 and 204. A conductive connection 246 connects the silicide 41 to tie region 14.

Figure 14:
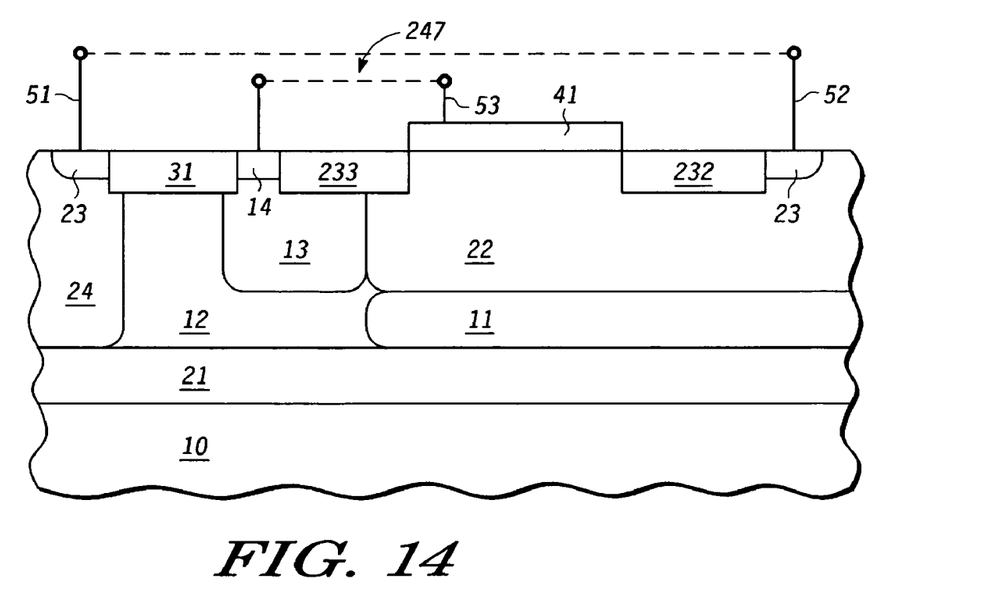

FIG. 14 illustrates a cross-sectional view of an alternate embodiment of the present disclosure. Specifically, the Schottky device of FIG. 14 is similar to the Schottky device of FIG. 10. Analogous regions between FIGS. 14 and 10 are commonly numbered. The Schottky device of FIG. 14 differs from the Schottky device of FIG. 10 in that dielectric spacers 232 and 233 are disposed over the substrate 10 within regions 13 and 22. In this manner, the length of Schottky region is the distance between the dielectric spacers 233 and 232. A conductive connection 247 connects the silicide 41 to tie region 14.

Figure 15:
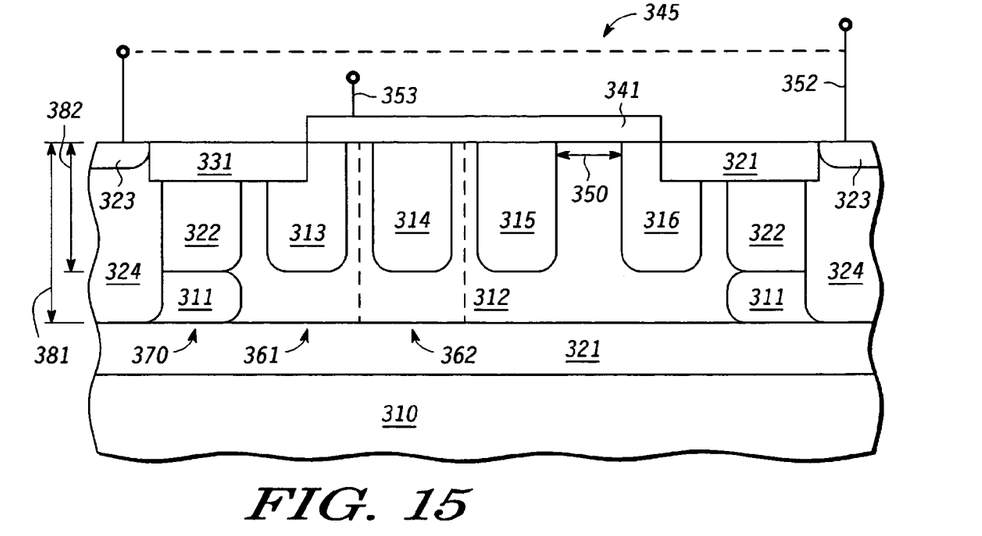
FIGS. 15 and 17 illustrate cross-sectional views of Schottky devices in accordance with alternate embodiments of the present disclosure.

FIG. 15 illustrates an alternate embodiment of a Schottky device utilizing a double RESURF termination as described previously. The Schottky device illustrated in FIG. 15 includes a plurality of unit cells that form the Schottky device. A unit cell 362 is specifically identified, and includes a region 314 of a first conductivity-type (i.e., P-type) laterally surrounded by and overlying a portion of region 312 of a second conductivity type (i.e., N-type). In addition, the unit cell 362 includes a Schottky contact formed at the region 312 and conductive layer 341 interfaces. In a similar manner, unit cell 361 is also formed, though the Schottky contact area of unit cell 361 is not as large as the Schottky contact area of unit cell 362 due to the dielectric layer 331. During a forward bias voltage condition, current flows from anode 353 through the Schottky contacts of the unit cells to layer 321, and finally to the cathode 352 through regions 324 and 323. Note that region 312, layer 321, region 324, and layer 323 are all of a common conductivity type. For purposes of discussion, it is assumed that each of these regions and layers are N-type, with region 312 having a doping concentration of 1e15-5e16/cm^3, which is similar to the extension doping of logic gates formed at a different location of the device (not illustrated), while layer 321, region 324, and layer 323 have doping concentrations similar to those of layer 21, region 24, and layer 23, respectively, as previously disclosed.

During a reverse bias voltage condition a depletion region is formed along each unit cell's N-type region and P-type region interface. This causes, for example, a depletion region to form between regions 313 and 314 in response to a reverse bias voltage condition. If the reverse bias voltage is large enough, the location between regions 313 and 314 will be completely depleted, thereby preventing any current from flowing in a reverse direction. To further facilitate protecting the Schottky device a termination structure 370 comprising layer 311 and layer 322 is formed. Layer 311 is a P-type layer and is formed overlying and abutting layer 321. Layer 321 also underlies and abuts N-type layer 322, and laterally abuts region 324. Note that a depth 381 of an interface between layer 311 and layer 321 is greater than a depth 382 of region 313, as measured from a plane at which the Schottky contacts are formed. Typically, a dopant concentration of layer 322 will be somewhat greater than the dopant concentration of layer 312, though not strictly necessary. In one embodiment, the doping concentration of layer 312 will be similar to that of layer 22 described previously.

Figure 16:
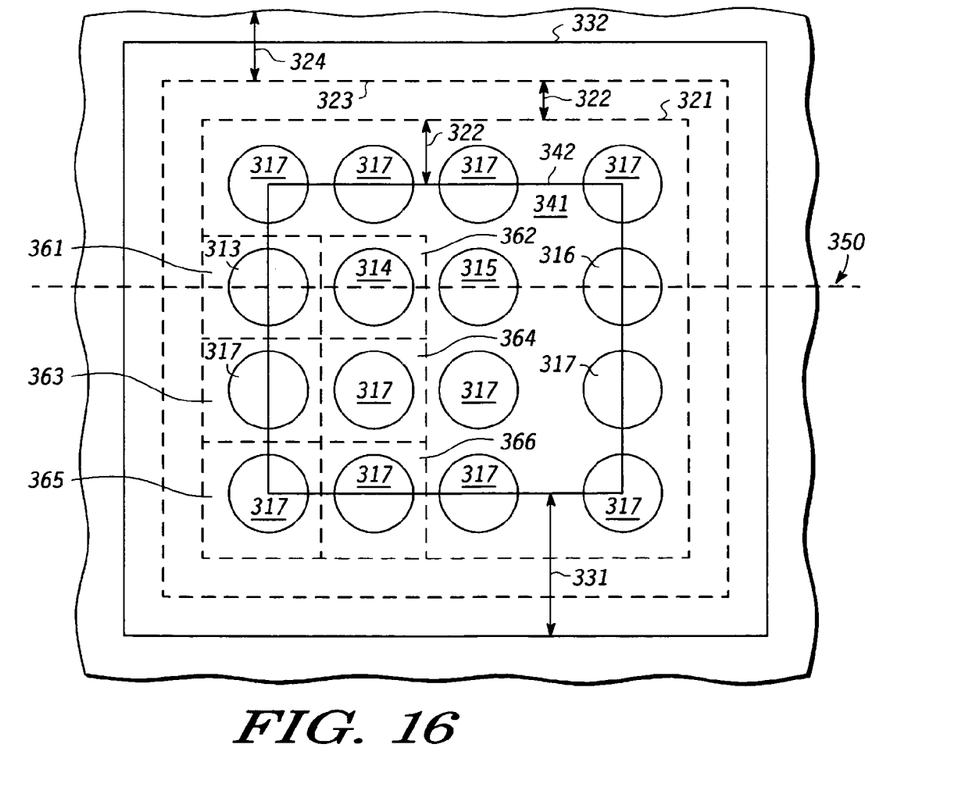
FIG. 16 illustrates a plan view of the Schottky devices of FIG. 15.

FIG. 16 illustrates a plan view of the device of FIG. 15, where the cross section view of FIG. 15 is along a plane defined by line 350 of FIG. 16. FIG. 16 includes a plurality of unit cells including unit cells 361-366, each of which includes a P-type structure surrounded by an N-type region. It will be appreciated that the shape of the unit cells can vary. For example, while each unit cell 363-366 is substantially square with a circular P-type structure, alternate shaped P-type structures can be used to define other unit cell shapes (e.g., oval, rectangular, hexagonal, and striped P-type structures can be used). Conductive layer 341, which forms the Schottky contact at its interface with region 312, resides within boundary 342. Dielectric layer 321 resides between boundaries 342 and 332. The termination structure 370 resides between boundaries 323 and 321. Note that layer 322 and termination structure 370 have coincident boundaries in the embodiment illustrated. Region 324 resides outside of boundary 323 as illustrated. The termination structure 370 is an annular structure surrounding the unit cells 313-317. Annular structure, as used herein, means a closed shape with a center opening, examples are closed round structures, such as ring, closed rectangular structures, such as the rectangular structure formed by 322, and other shaped-structures.

Termination structure 370 does not affect operation of the Schottky device during forward bias operation. However, during reverse bias conditions, a depletion region extending upward and outward from layer 311 (FIG. 15) facilitates rapid depletion of N-type region 312 at and below the Schottky contact of unit cell 361, such that the Schottky device of unit cells adjacent the termination structure are protected from damaging electric fields that occur during reverse bias. Note that dielectric layer 331 prevents a Schottky contact from forming between unit cell 361 and termination structure 370; thus, the nearest Schottky contact to the cathode contact 323 is the Schottky contact between P-regions 313 and 314.

Figure 17:
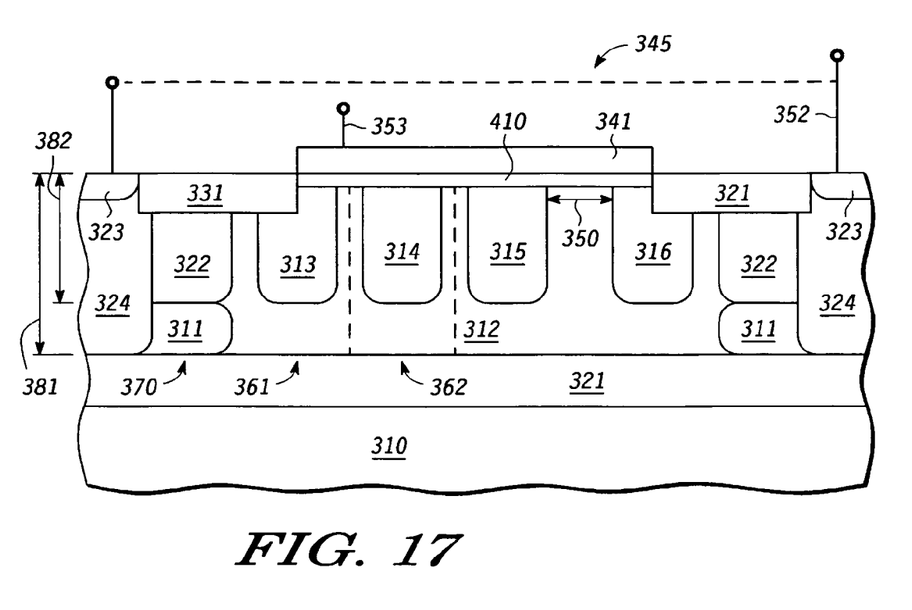

FIG. 17 illustrates an alternate embodiment of a Schottky device in accordance with the present disclosure that defines a N-type region surrounding P-type structures of the unit cells. The N-type region surrounding the unit cells' P-type structures include region 312 and region 410. In one embodiment, region 410 is a NDPLI type implant having a typical doping concentration in the range of 5e16-5e17/cm^3. The use of region 410 can enhance forward conduction without degrading reverse bias characteristics of the Schottky device.

The method and apparatus herein provide for a flexible implementation. Although described using certain specific examples, it will be apparent to those skilled in the art that the examples are illustrative, and that many variations exist. For example, various types of deposition and doping techniques and devices are currently available which could be suitable for use in employing the method as taught herein. One such example would be the use of highly doped contacts (ties) to each unit cell's P-type region. Note also, that although an embodiment of the present disclosure has been shown and described in detail herein, along with certain variants thereof, many other varied embodiments that incorporate the teachings of the disclosure may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

The invention claimed is:

1. A method of forming a Schottky device comprising:
  forming a first unit cell at a first location of a semiconductor substrate, wherein the first unit cell comprises a Schottky contact, and a structure of a first conductivity type laterally surrounded by and overlying a first region of a second conductivity type, wherein the Schottky contact is a Schottky contact to the first region;
  forming a termination structure at a second location of the semiconductor substrate comprising
    a first layer of the second conductivity-type;
    a second layer of the first conductivity-type overlying and abutting the first layer and abutting the first region, wherein a first interface is formed by the first and second layer and a depth of the first interface relative a plane formed by the Schottky contact is greater than a depth of the structure of the first unit cell at a location furthest from the plane formed by the Schottky contact;
    a third layer of the second conductivity-type overlying and abutting the second layer, wherein a second interface is formed by the third layer and the second layer; and
  forming a cathode contact at a third location of the semiconductor substrate; wherein, when viewed from a plan view, the termination structure is between the first unit cell and the cathode terminal contact.

2. The method of claim 1 wherein the termination structure comprises an annular structure surrounding the first unit cell, wherein the third layer is a portion of the annular structure.

3. The method of claim 1 further comprising forming a plurality of unit cells including the first unit cell.

4. The method of claim 1 further comprising forming a cathode contact electrically coupled to the first layer.

5. The method of claim 4 further comprising forming a second region of the second conductivity type electrically coupled to the first layer, wherein the cathode contact is electrically coupled to the first layer through the second region and the second region has a greater dopant concentration than the first region.

6. The method of claim 5 wherein the second region abuts the third layer.

7. The method of claim 1 wherein the first conductivity-type is P-doped and the second conductivity-type is N-doped.

8. The method of claim 1 further comprises forming a dielectric layer overlying and abutting the termination structure and the structure of the first unit cell.

9. The method of claim 1 wherein the first layer underlies the first region.

10. The method of claim 9 wherein the first layer abuts the first region.

11. The method of claim 1 wherein the unit cell further comprises the unit cell underlying the first region.

12. The method of claim 1 wherein the unit cell further comprises the unit cell underlying and abutting a conductive structure that forms the Schottky contact.

13. A method of a Schottky device comprising:
  forming a first unit cell at a first location of a semiconductor substrate, wherein the first unit cell comprises a Schottky contact, and a structure of a first conductivity type laterally surrounded by and overlying a first region of a second conductivity type, wherein the Schottky contact is a Schottky contact to the first region;
  forming a termination structure at a second location of the semiconductor substrate comprising
    a first layer of the second conductivity-type;
    a second layer of the first conductivity-type overlying and abutting the first layer and abutting the first region, wherein a first interface is formed by the first and second layer and a depth of the first interface relative a plane formed by the Schottky contact is greater than a depth of the structure of the first unit cell at a location furthest from the plane formed by the Schottky contact;
    a third layer of the second conductivity-type overlying and abutting the second layer wherein a second interface is formed by the third layer and the second layer;
  forming a second region of the second conductivity type electrically coupled to the first layer, wherein the second region has a greater dopant concentration than the third layer;
  forming a cathode contact to the second region, wherein, when viewed from a plan view, the termination structure is between the first unit cell and the cathode contact; and
  forming a dielectric layer overlying and abutting the termination structure and the structure of the first unit cell.

* * * * *

UNITED STATES PATENT AND TRADEMARK OFFICE
CERTIFICATE OF CORRECTION

PATENT NO. : 7,282,386 B2 Page 1 of 1
APPLICATION NO. : 11/117996
DATED : October 16, 2007
INVENTOR(S) : Vishnu Khemka et al.

It is certified that error appears in the above-identified patent and that said Letters Patent is hereby corrected as shown below:

Column No. 8, Line No. 32, change "method of a Schottky" to --method of forming a Schottky--

Signed and Sealed this

First Day of April, 2008

JON W. DUDAS
*Director of the United States Patent and Trademark Office*